United States Patent [19]
Raskin et al.

[11] Patent Number: 5,596,172
[45] Date of Patent: Jan. 21, 1997

[54] PLANAR ENCAPSULATION PROCESS

[75] Inventors: Glenn D. Raskin; Setsuko J. Cole, both of Phoenix; Mark C. Hoggatt, Mesa, all of Ariz.

[73] Assignee: Motorola, Inc., Schaumburg, Ill.

[21] Appl. No.: 560,505

[22] Filed: Nov. 17, 1995

Related U.S. Application Data

[63] Continuation of Ser. No. 57,930, May 7, 1993, abandoned.

[51] Int. Cl.⁶ .................. H01L 23/02; H01L 23/28; H01L 23/14; H01L 23/10
[52] U.S. Cl. .................. 174/52.4; 174/52.2; 257/702; 257/706; 257/713
[58] Field of Search .................. 174/52.1, 52.2, 174/52.3, 52.4; 257/678, 701, 702, 706, 707, 713

[56] References Cited

U.S. PATENT DOCUMENTS

| | | | |
|---|---|---|---|
| 4,710,797 | 12/1987 | Tanaka | 357/74 |
| 4,733,289 | 3/1988 | Tsurumaru | 357/54 |
| 4,845,543 | 7/1989 | Okigawa | 357/67 |
| 4,984,059 | 1/1991 | Kubota | 357/68 |
| 5,072,289 | 12/1991 | Sugimoto | 357/68 |
| 5,153,385 | 10/1992 | Juskey | 174/260 |
| 5,208,467 | 5/1993 | Yamazaki | 257/667 |
| 5,233,130 | 8/1993 | Nishino | 174/52.2 |
| 5,422,383 | 6/1995 | Takahashi | 523/136 |
| 5,426,330 | 6/1995 | Joshi | 257/752 |

FOREIGN PATENT DOCUMENTS

| | | | |
|---|---|---|---|
| 970882 | 7/1975 | Canada | 174/52.2 |
| 1043019 | 11/1978 | Canada | 174/52.2 |

*Primary Examiner*—Leo P. Picard
*Assistant Examiner*—Stephen T. Ryan
*Attorney, Agent, or Firm*—Michael D. Bingham; Gary W. Hoshizaki

[57] ABSTRACT

A method for encapsulating a surface of an integrated circuit to protect the surface. The surface has an outer peripheral area and an inner area to be encapsulated. A frame is provided for handling an integrated circuit package. A plurality of leads are coupled between the frame and the outer peripheral area. An encapsulation material is dispensed on the outer peripheral area covering and protecting a portion of the leads and integrated circuit. A planar encapsulation material is deposited for covering and protecting the inner area. The planar encapsulation material provides a planar surface.

10 Claims, 2 Drawing Sheets

PLANAR ENCAPSULATION PROCESS

This application is a continuation of prior application Ser. No. 08/057,930, filed May 7, 1993, now abandoned.

BACKGROUND OF THE INVENTION

This invention relates, in general, to the encapsulation of an integrated circuit and more particularly to forming a planar encapsulated surface on an integrated circuit.

Protecting an integrated circuit from an external environment is traditionally accomplished through packaging. Packaging technology is as diverse as the semiconductor circuits protected therein. Wafer processing technologies have greatly increased the complexity of integrated circuit designs. High package pin counts (from hundreds to thousands of pins) and high power dissipation (greater than 50 watts) are a result of the increase in circuit density and performance.

Various types of integrated circuit packages have evolved to accommodate the high pin counts and power dissipation requirements. One such packaging technology is tape automated bonding hereafter known as TAB. TAB is well known in the packaging arts and generally provides high pin counts and flexibility for different user applications. A simple description of a TAB package is an array of tightly spaced leads bonded to an integrated circuit. A frame is sometimes used to hold the lead ends not bonded to the integrated circuit. Also, a polyimide layer is placed on the leads to support the leads.

Access to the back of the integrated circuit in the TAB format simplifies coupling to a heat sink in a multi-chip module or a printed circuit board application. Heat sinks are generally attached to the back surface of the integrated circuit. The front surface of the integrated circuit is the surface on which the semiconductor devices are formed. The front surface faces the printed circuit board to expose the back surface. For example, a TAB package electrically coupled through the bonded leads to a printed circuit board is mounted with the front surface of the integrated circuit facing the printed circuit. A spacer or elastomer is placed between the front surface and the printed circuit board to reduce stress and damage to the integrated circuit. A heat sink couples to the back surface of the integrated circuit and is fastened to the printed circuit board to hold the TAB package in place.

If the front surface of the integrated circuit is left unprotected and directly contacts the spacer material it may be prone to premature failure due to chemical exposure or mechanical damage. To prevent this problem, an encapsulation material is placed on the front surface of the integrated circuit and lead bond areas. The encapsulation material can be an epoxy, silicone, or polyimide, etc. that is placed on the front surface and allowed to flow over the entire surface. The encapsulation material is dispensed non-selectively since manufacturing throughput is critical and results in an irregular and a non-planar surface being formed (on the encapsulation material). The irregularity of the surface of the encapsulation material is caused by filler material in the encapsulation material and viscous flow of the encapsulation material. The non-planar surface of the encapsulation material contacts the spacer material such that the back surface of the integrated circuit is tilted with respect to the heat sink making poor thermal contact. Also, the non-planar surface of the encapsulation material can produce localized areas of stress on the front surface of the integrated circuit affecting circuit performance and reliability. These problems will further result in increased manufacturing time, cost, and be a potential device failure in the field. It would be of great benefit if the surface of the integrated circuit could be protected from an external environment and provide a planar surface.

SUMMARY OF THE INVENTION

Briefly stated, this invention provides an integrated circuit package having at least one surface protected from an external environment and a method therefor.

The integrated circuit package comprises a frame, an integrated circuit, a plurality of leads, an epoxy encapsulant, and an adhesive film. Each of the plurality of leads are bonded at one end to the integrated circuit and fastened at the other end to the frame. A surface of the integrated circuit has an outer peripheral area and an inner area. The plurality of leads are bonded to the integrated circuit in the outer peripheral area. The epoxy encapsulant covers the outer peripheral area of the integrated circuit. The adhesive film covers the inner area of the integrated circuit and provides a planar surface. The epoxy encapsulant and the adhesive film combine to protect the integrated circuit from the external environment.

The method for encapsulating the surface of the integrated circuit comprises dispensing an encapsulation material on the outer peripheral area of the surface and depositing a planar encapsulation material on the inner area of the surface.

DETAILED DESCRIPTION OF THE DRAWINGS

Figure 1:
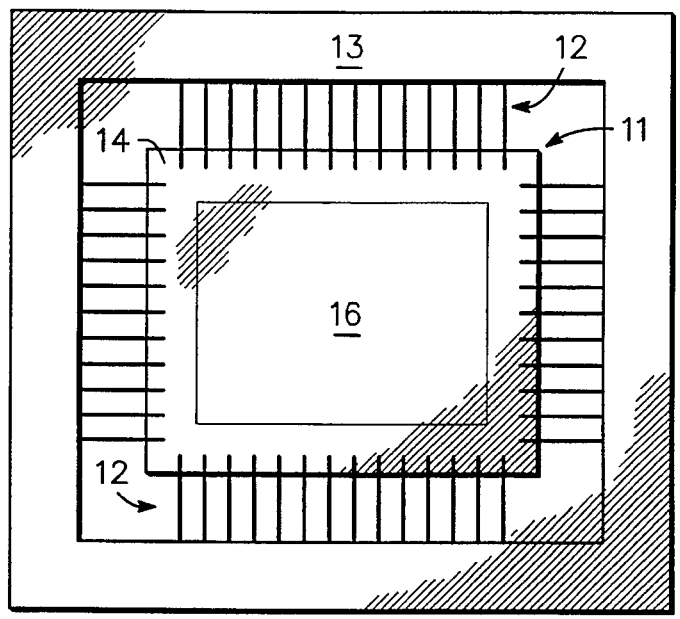
FIG. 1 is a top view of a semiconductor package before encapsulation in accordance with the present invention.

FIG. 1 is a top view of a semiconductor package 17 before encapsulation.

Semiconductor package 17 comprises an integrated circuit 11, a plurality of leads 12, and a frame 13. One end of each lead 12 is bonded to integrated circuit 11 and the other end is coupled to frame 13. Frame 13 is used for handling integrated circuit 11 and leads 12. Frame 13 is discarded after leads 12 are bonded to a printed circuit board or a multi-chip module (detaching leads 12 from frame 13) as is well known by those skilled in the art.

A surface of integrated circuit 11 is partitioned into two areas, an outer peripheral area 14 and an inner area 16. Outer peripheral area 14 extends along the perimeter of integrated circuit 11 and typically is where leads 12 are bonded. Inner area 16 is the area of integrated circuit 11 where semiconductor devices are formed and interconnected to create a circuit. For many package applications it is important to have a planar surface in inner area 16.

Figure 2:
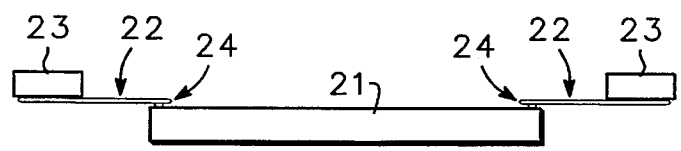
FIG. 2 is a cross-sectional view of an integrated circuit showing a plurality of leads bonded thereto in accordance with the present invention.

FIG. 2 is a cross-sectional view of an integrated circuit 21 having a plurality of leads 22 bonded thereto. FIG. 2 corresponds to semiconductor package 17 illustrated in FIG. 1.

Plurality of leads 22 is bonded to integrated circuit 21 for providing electrical interconnect. Bonds 24 are typically solder, gold, tin, copper or other similar bonding material that provides mechanical strength for fastening leads 22 to integrated circuit 21 as well as electrical interconnect. In the preferred embodiment, leads 22 are flexible and therefore may be easily damaged. A support layer 23 is formed on leads 22 to provide further mechanical strength to constrain leads 22 from twisting or flexing thereby damaging to leads 22. Support layer 23 is formed from a material such as polyimide that also has electrical insulative properties.

Figure 3:
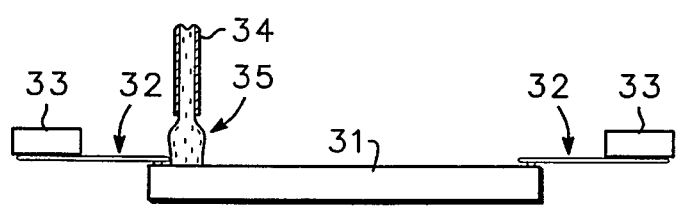
FIG. 3 is an illustration of an encapsulation material being dispensed onto an integrated circuit in accordance with the present invention.

FIG. 3 is an illustration of an encapsulation material 35 being deposited on an integrated circuit 31 and a plurality of leads 32.

Plurality of leads 32 are bonded to integrated circuit 31 and supported by a support layer 33 similar to that shown in FIG. 2. A needle 34 dispenses an encapsulation material 35 on integrated circuit 31 and leads 32. In the preferred embodiment, leads 32 are bonded in an area along the perimeter of integrated circuit 31 corresponding to outer peripheral area 14 of FIG. 1. Needle 34 carefully dispenses encapsulation material 35 along the perimeter covering a portion of leads 32 that extend over the surface of integrated circuit 31. In the preferred embodiment, encapsulation material 35 is an epoxy. The epoxy is dissolved in solvent to allow it to flow easily through needle 34.

Figure 4:
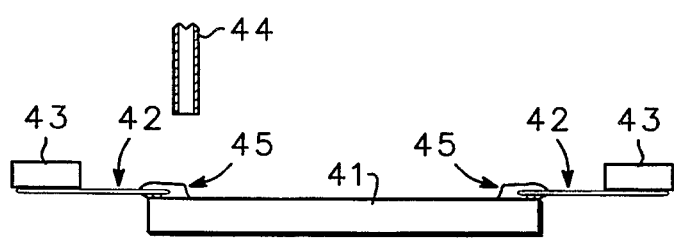
FIG. 4 is an illustration of an encapsulation material coupling to package leads and an integrated circuit in accordance with the present invention.

FIG. 4 is an illustration of an encapsulation material 45 coupling to a plurality of leads 42 and an integrated circuit 41.

Plurality of leads 42 are bonded to integrated circuit 41 and supported by a support layer 43 similar to that shown in FIG. 2. Encapsulation material 45 has been dispensed on integrated circuit 41 corresponding to the description of FIG. 3. Encapsulation material 45 will flow around a portion of leads 42 and on integrated circuit 41 as a needle 44 dispenses encapsulation material 45 along the perimeter of integrated circuit. The amount of encapsulation material 45 placed on leads 42 and integrated circuit 41 is carefully controlled to insure coverage localized around the perimeter of integrated circuit 41. Also, encapsulation material 45 should not flow down leads 42 towards support layer 43, after hardening, encapsulation material 45 would reduce flexibility of leads 42 such that interconnection of leads 42 would be hampered.

Figure 5:
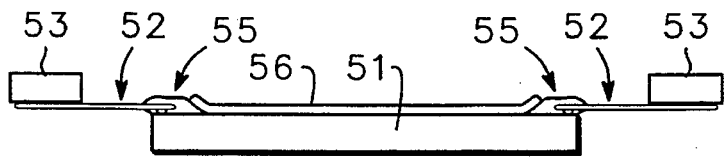
FIG. 5 is an illustration of a planar encapsulation material deposited on an integrated circuit in accordance with the present invention.

FIG. 5 is an illustration of a planar encapsulation material 56 deposited on an integrated circuit 51. A plurality of leads 52 are bonded to integrated circuit 51 and supported by a support layer 53 similar to that shown in FIG. 2. Encapsulation material 55 has been dispensed on integrated circuit 41 corresponding to the descriptions of FIG. 3 and FIG. 4.

Planar encapsulation material 56 is deposited on the surface of integrated circuit 51 corresponding to inner area 16 of FIG. 1. In the preferred embodiment, planar encapsulation material 56 is an adhesive film or thermoplastic. Staystik Inc. is a company offering a line of thermoplastic adhesives, for example, thermoplastic film 482B, compatible as planar encapsulation material 56. A thermoplastic adhesive film such as the 482B softens when heated and adheres to the surface to which it contacts forming a strong bond. Planar encapsulation material 56 conforms to the shape of the surface it contacts (the surface of integrated circuit 51 being planar) thereby forming a planar layer protecting the surface of integrated circuit 51 from an external environment. As shown in FIG. 5 planar encapsulation material 56 slightly overlaps encapsulation material 55 to insure encapsulation of the entire surface of integrated circuit 51.

Two thermal cycles are run to encapsulate integrated circuit 51. A first thermal cycle at 100 degrees centigrade is run for approximately 15 minutes to remove solvent from the epoxy used for encapsulation material 55. A second thermal cycle at 150 degrees centigrade is run for approximately 15 minutes to cure the epoxy and to soften the adhesive film used for planar encapsulation material 56. Both encapsulation material 55 and planar encapsulation material 56 forms a strong bond to the surface of integrated circuit 51 protecting the surface from an external environment. Planar encapsulation material 56 conforms to the surface of integrated circuit 51 and has a planar surface.

Figure 6:
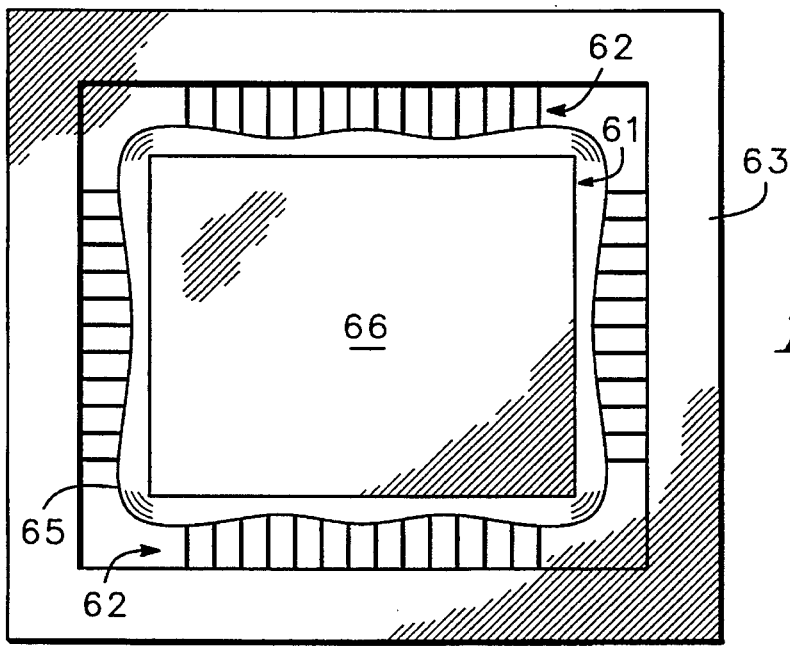
FIG. 6 is a top view of an encapsulated semiconductor package after encapsulation in accordance with the present invention.

FIG. 6 is a top view of a semiconductor package 67 having an integrated circuit 61 that is encapsulated by a process similar to that described in FIGS. 2,3,4, and 5. Semiconductor package 67 comprises an integrated circuit 61, a plurality of leads 62, a frame 63, an encapsulation material 65, and a planar encapsulation material 66.

Leads 62 are bonded to integrated circuit 61 similar to leads 12 of FIG. 1. In the preferred embodiment, leads 62 are coupled to integrated circuit 61 on the periphery. The periphery corresponds to outer peripheral area 14 shown in FIG. 1. Encapsulation material 65 covers and protects a portion of leads 12 extending over integrated circuit 61 as well as the outer peripheral area. Planar encapsulation material 66 covers an area of integrated circuit 61 corresponding to inner area 16 shown in FIG. 1. In the preferred embodiment, semiconductor devices are formed on the surface covered by planar encapsulation material 66. Planar encapsulation material 66 provides a planar surface, yet protects the semiconductor devices formed beneath it from an external environment.

Figure 7:
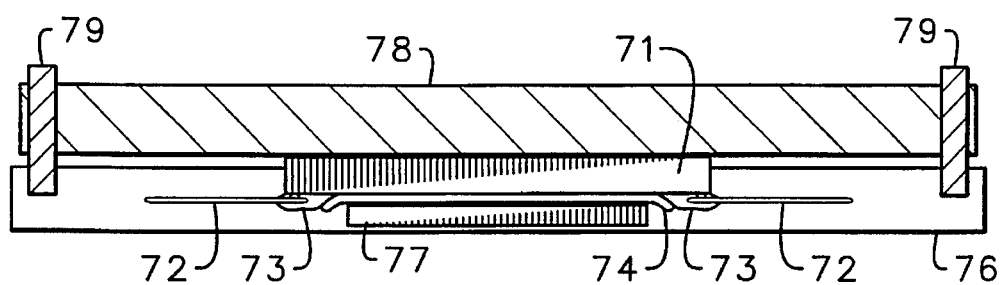
FIG. 7 is an illustration of a heat sink coupled to an integrated circuit in accordance with the present invention.

FIG. 7 is an illustration of an application where a protected planar surface of an integrated circuit is essential. An integrated circuit 71 having a plurality of leads 72 coupled to and extending from the surface is connected to a printed circuit board 76. The connections of leads 72 to printed circuit board 76 are not shown in FIG. 7. Integrated circuit 71 has an encapsulation material 73 covering the periphery of integrated circuit 71 and a planar encapsulation material 74 covering the area interior to the periphery of integrated circuit 71 as described above. Semiconductor devices are formed on the surface below planar encapsulation material 74.

For maximum thermal dissipation from integrated circuit 71 it is critical that a heat sink 78 contacts as much surface area of integrated circuit 71 as possible. In the preferred embodiment, heat sink 78 couples to the back surface of integrated circuit 71. The back surface of integrated circuit 71 is the surface having no semiconductor devices, thus heat sink 71 can make direct contact without fear of contamination or mechanical damage to any circuitry.

A spacer 77 is placed between the surface of planar encapsulation material 74 and the surface of printed circuit board 76. The spacer could contaminate or cause mechanical damage to integrated circuit 71 if planar encapsulation material 74 was not used. A critical feature of planar encapsulation material 74 is that it is planar and parallel to the back surface of integrated circuit 71 allowing maximum coupling to heat sink 78. The planar surface of planar encapsulation material 74 also distributes pressure evenly through contact from spacer 77 reducing stress problems. Hold down elements 79 couple heat sink 78 to printed circuit board 76.

By now it should be appreciated that an integrated circuit package has been provided and a method therefor. The integrated circuit package provides a bare surface (back surface) and an encapsulated surface providing a protected planar area that is parallel to the back surface.

We claim:

1. An integrated circuit package comprising:
   a frame;
   an integrated circuit within and planar to said frame, said integrated circuit having a surface wherein semiconductor devices are formed thereon, said surface including an outer peripheral area and an inner area;
   a plurality of leads coupled between said frame and said outer peripheral area of said integrated circuit;
   an epoxy encapsulate covering said outer peripheral area of said integrated circuit and a portion of said plurality of leads; and
   a thermoplastic film contiguous with and planar to said inner area of said surface of said integrated circuit wherein said thermoplastic film protects against mechanical damage to said surface of said integrated circuit having semiconductor devices when an object is pressed against said thermoplastic film.

2. An integrated circuit package as recited in claim 1 wherein said thermoplastic film includes a planar outward facing surface and wherein a heat sink is forcibly pressed against said outward facing surface of said thermoplastic film for dissipating heat from said integrated circuit said heat sink is pressed against said planar outward facing surface.

3. An integrated circuit package as recited in claim 1 wherein said epoxy encapsulate and said adhesive film combine to cover said surface of said integrated circuit.

4. An integrated circuit package as recited in claim 1 wherein a layer of polyimide supports said plurality of leads.

5. A tape automated bonding (TAB) package comprising:
   a TAB frame;
   an integrated circuit within and planar to said frame, said integrated circuit having a surface wherein semiconductor devices are formed thereon and a back surface, said surface including an outer peripheral area and an inner area;
   a plurality of leads coupled between said frame and said outer peripheral area of said integrated circuit;
   an adhesive film contiguous with and planar to said inner area of said surface of said integrated circuit;
   an epoxy encapsulant covering said outer peripheral area of said surface wherein said epoxy encapsul. ant and said adhesive film combine to cover said semiconductor advice of said integrated circuit; and
   a heat sink collpled to said adhesive film wherein said adhesive film provides a planar surface for maximizing contact area to said heat sink for dissipating heat from said integrated circuit while preventing mechanical damage to said integrated circuit.

6. The integrated circuit package as recited in claim 5 wherein said adhesive film includes a planar outward facing surface and wherein said heat sink is pressed against said planar outward facing surface.

7. The integrated drcuit package as recited in claim 5 an epoxy encapsulate covering said outer peripheral area of said integrated circuit and a portion of said plurality of leads and wherein said epoxy encapsulate and said adhesive film combine to cover said surface of said integrated circuit for protecting said surface from damage due to an external environment.

8. The integrated circuit package as recited in claim 5 wherein a support material is placed on said plurality of leads for preventing said plurality of leads from being bent or twisted.

9. The integrated circuit package as recited in claim 8 wherein said support material is polyimide.

10. An integrated circuit package comprising:
    a frame;
    an integrated circuit within and planar to said frame, said integrated circuit having a surface wherein semiconductor devices are formed thereon and a back surface, said surface including an outer peripheral area and an inner area;
    a plurality of leads coupled between said frame and said outer peripheral area of said integrated circuit;
    an epoxy encapsulate covering said outer peripheral area of said integrated circuit and a portion of said plurality of leads; and
    a thermoplastic film contiguous with and planar to said inner area of said surface of said integrated circuit wherein the integrated circuit package is coupled between a heat sink and a printed circuit board, said back surface of said integrated circuit being exposed for maximizing heat transfer to said heat sink, said thermoplastic film being planar for distributing stress evenly across said surface of said integrated circuit and preventing mechanical damage to said integrated circuit when coupled to said printed circuit board.

* * * * *

UNITED STATES PATENT AND TRADEMARK OFFICE
CERTIFICATE OF CORRECTION

PATENT NO. : 5,596,172
DATED : January 21, 1997
INVENTOR(S) : Glenna Raskin
Setsuko V. Cole
Mark C. Hoggatt It is certified that error appears in the above-indentified patent and that said Letters Patent is hereby corrected as shown below:

Claim 5, column 6, line 4
Delete "encapsul. ant" and insert --encapsulant--therefor.

Claim 5, column 6, line 7
Delete "advice" and insert --devices-- therefor.

Claim 5, column 6, line 8
Delete "collpled" and insert --coupled--.

Signed and Sealed this

Twenty-first Day of October 1997

Attest:

BRUCE LEHMAN

*Attesting Officer*  *Commissioner of Patents and Trademarks*